(12) United States Patent
Dykaar

(10) Patent No.: US 11,616,340 B2
(45) Date of Patent: Mar. 28, 2023

(54) METHODS AND SYSTEMS TO GENERATE LASER LIGHT

(71) Applicant: GOOGLE LLC, Mountain View, CA (US)

(72) Inventor: Douglas Raymond Dykaar, Waterloo (CA)

(73) Assignee: GOOGLE LLC, Mountain View, CA (US)

(*) Notice: Subject to any disclaimer, the term of this patent is extended or adjusted under 35 U.S.C. 154(b) by 501 days.

(21) Appl. No.: 16/796,294

(22) Filed: Feb. 20, 2020

(65) Prior Publication Data

US 2020/0274324 A1    Aug. 27, 2020

Related U.S. Application Data

(60) Provisional application No. 62/809,025, filed on Feb. 22, 2019.

(51) Int. Cl.
| | | |
|---|---|---|
| *H01S 5/0687* | (2006.01) | |
| *H01S 5/50* | (2006.01) | |
| *H01S 5/068* | (2006.01) | |
| *H01S 5/12* | (2021.01) | |

(52) U.S. Cl.
CPC ........ *H01S 5/0687* (2013.01); *H01S 5/06808* (2013.01); *H01S 5/1234* (2013.01); *H01S 5/509* (2013.01)

(58) Field of Classification Search
CPC ..... H01S 5/06808; H01S 5/1234; H01S 5/509
See application file for complete search history.

(56) References Cited

U.S. PATENT DOCUMENTS

| | | | | |
|---|---|---|---|---|
| 6,366,592 B1* | 4/2002 | Flanders | ................. | H01S 5/141 |
| | | | | 372/18 |
| 2005/0254056 A1* | 11/2005 | Kachanov | ................. | G01J 3/42 |
| | | | | 356/437 |

\* cited by examiner

*Primary Examiner* — Tuan N Nguyen

(57) ABSTRACT

There is provided a method of operating a laser. The method comprises receiving a target power and calculating an operating power of a lasing module of the laser. The operating power may be calculated based on the target power and a minimum lasing power of the lasing module. The method also comprises determining an operating current for the lasing module based on the operating power, and driving the lasing module at the operating current to produce an output light having the operating power. In addition, the method comprises providing the output light to an optical modulator of the laser, and operating the optical modulator to modulate the output light to have an output power corresponding to the target power.

15 Claims, 12 Drawing Sheets

METHODS AND SYSTEMS TO GENERATE LASER LIGHT

CROSS REFERENCE TO RELATED APPLICATIONS

This application claims the benefit of U.S. Provisional Application No. 62/809,025, filed Feb. 22, 2019, titled "Methods and Systems to Generate Light", the content of which is incorporated herein in its entirety by reference.

FIELD

The present specification relates to methods and systems to generate light, and in particular to methods and systems to generate laser light.

BACKGROUND

Electric light sources may be used to generate light. Different types of electric light sources use different underlying physical processes to convert electrical power into light. Laser light sources are one of the types of electric light sources. Laser light sources may be used in a variety of applications including image projection.

SUMMARY

According to an implementation of the present specification there is provided a method of operating a laser, the method comprising: receiving a target power; calculating an operating power of a lasing module of the laser, the operating power calculated based on the target power and a minimum lasing power of the lasing module; determining an operating current for the lasing module based on the operating power; driving the lasing module at the operating current to produce an output light having the operating power; providing the output light to an optical modulator of the laser; and operating the optical modulator to modulate the output light to have an output power corresponding to the target power.

The lasing module may have a minimum lasing threshold; and the minimum lasing power may be equal to or greater than the minimum lasing threshold.

The calculating the operating power may comprise: comparing the target power to the minimum lasing power; and if the target power is below the minimum lasing power, setting the operating power to be equal to or greater than the minimum lasing power.

The operating the optical modulator to modulate the output light may comprise: operating the optical modulator to attenuate the operating power to provide the target power.

The lasing module may comprise an optical resonance cavity and a gain medium optically coupled with the optical resonance cavity; the optical modulator may comprise a semiconductor optical amplifier disposed outside the optical resonance cavity; and the operating the optical modulator to attenuate the output light may comprise biasing the semiconductor optical amplifier to absorb some of the output light.

The biasing the semiconductor optical amplifier to absorb some of the output light may comprise one of: biasing the semiconductor optical amplifier at zero; and reverse biasing the semi conductor optical amplifier.

The calculating the operating power may further comprise: if the target power is equal to or greater than the minimum lasing power, setting the operating power to be about equal to the target power.

The calculating the operating power may further comprise: comparing the target power to a maximum lasing power of the lasing module; and if the target power exceeds the maximum lasing power, setting the operating power to be equal to or less than the maximum lasing power.

The operating the optical modulator to modulate the output light may comprise: operating the optical modulator to amplify the operating power to provide the target power.

The lasing module may comprise an optical resonance cavity and a gain medium optically coupled with the optical resonance cavity; the optical modulator may comprise a semiconductor optical amplifier disposed outside the optical resonance cavity; and the operating the optical modulator to amplify the output light may comprise biasing the semiconductor optical amplifier to emit light when stimulated by the output light of the lasing module.

The calculating the operating power may further comprise: if the target power is greater than or equal the minimum lasing power and less than or equal to the maximum lasing power, setting the operating power to be about equal to the target power.

The lasing module may comprise an optical resonance cavity and a gain medium optically coupled with the optical resonance cavity; the optical modulator may comprise a semiconductor optical amplifier disposed outside the optical resonance cavity; and the operating the optical modulator to modulate the output light may comprise operating the semiconductor optical amplifier to be about transparent to the output light of the lasing module.

The operating the semiconductor optical amplifier to be about transparent to the output light of the lasing module may comprise biasing the semiconductor optical amplifier to be about transparent to the output light.

The method may further comprise receiving a temperature of the lasing module. The determining the operating current for the lasing module may comprise determining the operating current based on the operating power and the temperature.

The target power may represent an intensity of a color of a pixel of an image.

The method may further comprise projecting the output light onto a display element of a wearable heads-up display to form a portion of the image.

The method may further comprise: receiving a temperature of the display element; and operating a wavelength selection module of the laser to set a wavelength of the output light of the lasing module based on the temperature.

The display element may comprise a holographic optical element.

The method may further comprise: operating a wavelength selection module of the laser to set a wavelength of the output light of the lasing module to be about equal to a target wavelength.

The lasing module may comprise an optical resonance cavity and a gain medium optically coupled with the optical resonance cavity; and the wavelength selection module may comprise a tuneable Bragg reflector disposed in the optical resonance cavity.

The method may further comprise: sensing the wavelength of the output light using a wavelength sensor; comparing the wavelength with the target wavelength; and if the wavelength deviates from the target wavelength by an offset, operating the wavelength selection module to adjust the wavelength to reduce the offset.

According to another implementation of the present specification there is provided a system to generate laser light, the system comprising: a lasing module comprising an optical resonance cavity and a gain medium optically coupled with the optical resonance cavity; an optical modulator positioned to receive an output light generated by the lasing module; and a controller in communication with the lasing module and the optical modulator. The controller is to: receive a target power; calculate an operating power of the lasing module based on the target power and a minimum lasing power of the lasing module; determine an operating current for the lasing module based on the operating power; drive the lasing module at the operating current to produce the output light having the operating power; and operate the optical modulator to modulate the output light to have an output power corresponding to the target power.

The lasing module may have a minimum lasing threshold; and the minimum lasing power may be equal to or greater than the minimum lasing threshold.

To calculate the operating power the controller may be to: compare the target power to the minimum lasing power; and if the target power is below the minimum lasing power, set the operating power to be equal to or greater than the minimum lasing power.

To operate the optical modulator to modulate the output light the controller may be to: operate the optical modulator to attenuate the operating power to provide the target power.

The optical modulator may comprise a semiconductor optical amplifier disposed outside the optical resonance cavity; and to operate the optical modulator to attenuate the output light the controller may be to bias the semiconductor optical amplifier to absorb some of the output light.

To bias the semiconductor optical amplifier to absorb some of the output light the controller may be to one of: bias the semiconductor optical amplifier at zero; and reverse bias the semiconductor optical amplifier.

To calculate the operating power the controller may be further to: if the target power is equal to or greater than the minimum lasing power, set the operating power to be about equal to the target power.

To calculate the operating power the controller may be further to: compare the target power to a maximum lasing power of the lasing module; and if the target power exceeds the maximum lasing power, set the operating power to be equal to or less than the maximum lasing power.

To operate the optical modulator to modulate the output light the controller may be to: operate the optical modulator to amplify the operating power to provide the target power.

The optical modulator may comprise a semiconductor optical amplifier disposed outside the optical resonance cavity; and to operate the optical modulator to amplify the output light the controller may be to bias the semiconductor optical amplifier to emit light when stimulated by the output light of the lasing module.

The controller may be further to: if the target power is greater than or equal the minimum lasing power and less than or equal to the maximum lasing power, set the operating power to be about equal to the target power.

The optical modulator may comprise a semiconductor optical amplifier disposed outside the optical resonance cavity; and to operate the optical modulator to modulate the output light the controller may be to operate the semiconductor optical amplifier to be about transparent to the output light of the lasing module.

To operate the semiconductor optical amplifier to be about transparent to the output light the controller may be to bias the semiconductor optical amplifier to be about transparent to the output light.

The controller may be further to: receive a temperature of the lasing module; and determine the operating current based on the operating power and the temperature.

The target power may represent an intensity of a color of a pixel of an image.

The output light may be to be projected onto a display element of a wearable heads-up display to form a portion of the image.

The system may further comprise: a wavelength selection module to set a wavelength of the output light, the wavelength selection module in communication with the controller. The controller may be further to: receive a temperature of the display element; and operate the wavelength selection module to set the wavelength of the output light based on the temperature.

The display element may comprise a holographic optical element.

The system may further comprise a wavelength selection module to set a wavelength of the output light, the wavelength selection module in communication with the controller.

The controller may be further to: operate the wavelength selection module to set the wavelength of the output light of the lasing module to be about equal to a target wavelength.

The wavelength selection module may comprise a tuneable Bragg reflector disposed in the optical resonance cavity.

The system may further comprise: a wavelength sensor in optical communication with the lasing module and in communication with the controller, the wavelength sensor to sense the wavelength of the output light. The controller may be further to: receive the wavelength from the wavelength sensor; compare the wavelength with the target wavelength; and if the wavelength deviates from the target wavelength by an offset, operate the wavelength selection module to adjust the wavelength to reduce the offset.

According to another implementation of the present specification there is provided a system to display an image, the system comprising: a lasing module to generate an output light; an optical modulator positioned to receive the output light from the lasing module; a spatial modulator to receive the output light from the optical modulator; a display element to receive the output light from the spatial modulator; and a controller in communication with the lasing module, the optical modulator, and the spatial modulator. The controller is to: receive image data related to a pixel of the image; obtain a target power and a target position from the image data; calculate an operating power of the lasing module based on the target power and a minimum lasing power of the lasing module; determine an operating current for the lasing module based on the operating power; drive the lasing module at the operating current to produce the output light having the operating power; operate the optical modulator to modulate the output light to have an output power corresponding to the target power; and operate the spatial modulator to direct the output light onto the display element based on the target position.

The lasing module may have a minimum lasing threshold; and the minimum lasing power may be equal to or greater than the minimum lasing threshold.

To calculate the operating power the controller may be to: compare the target power to the minimum lasing power; and if the target power is below the minimum lasing power, set the operating power to be equal to or greater than the minimum lasing power.

To operate the optical modulator to modulate the output light the controller may be to: operate the optical modulator to attenuate the operating power to provide the target power.

The system may further comprise: a wavelength selection module to set a wavelength of the output light, the wavelength selection module in communication with the controller. The controller may be further to: receive a temperature of the display element; and operate the wavelength selection module to set the wavelength of the output light based on the temperature.

The display element may comprise a holographic optical element.

The spatial modulator may comprise a scan mirror.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, and the like. In other instances, well-known structures associated with light sources have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

Figure 1:
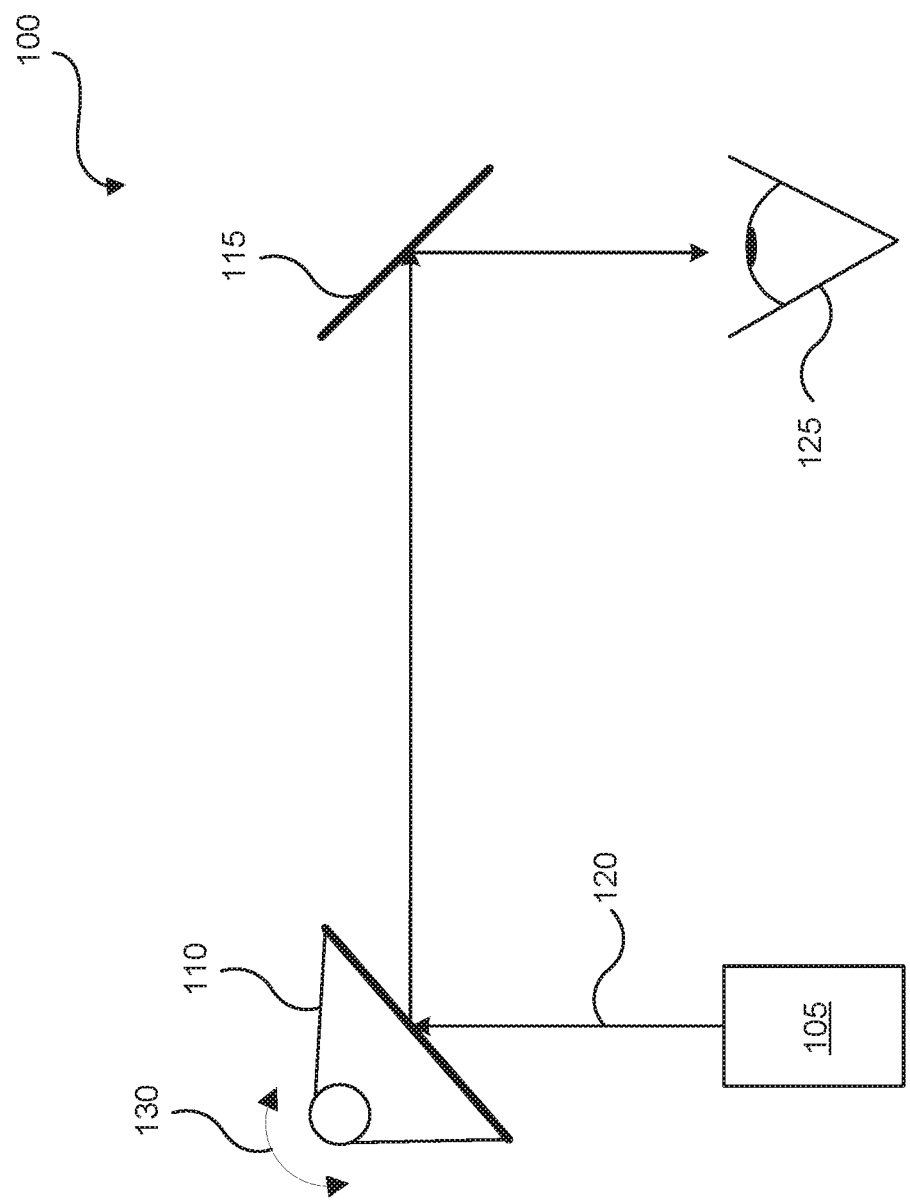
FIG. 1 shows a schematic representation of an example system which may be used to display an image, in accordance with a non-limiting implementation of the present specification.

FIG. 1 shows a schematic representation of an example system 100, which may be used to display an image. System 100 comprises a light source 105, a spatial modulator 110, and a display element 115. Light source 105 may generate a beam 120 of light, which is received by spatial modulator 110. Spatial modulator 110, in turn, may direct beam 120 onto any one of an array of positions on display element 115, each position representing a pixel of an image. Display element 115 may then direct beam 120 towards an eye 125 of a viewer, who may in turn perceive the image. FIG. 1 shows spatial modulator 110 as comprising a swivel reflector that may swivel along directions 130. The swivel reflector may also be referred to as a scan mirror. In some examples, the spatial modular may comprise a different mechanism, including a digital micromirror device (DMD), multiple swivel mirrors, and the like.

In some examples, light source 105 may comprise a laser light source. The image data may dictate the intensity of the laser light for each pixel of the image. For example, if a given pixel of the image is relatively bright, then the image data may dictate that the laser light have a relatively higher intensity when illuminating the given pixel. Similarly, if another pixel of the image is relatively dark, then the image data may dictate that the laser light have a relatively lower intensity when illuminating the other pixel. As such, during image projection the intensity of the laser light may change from one pixel to another, based on the image data.

The intensity of a laser light source over time may represent a power output of the laser light source. For time periods during which the intensity is substantially constant, average power may be used interchangeably with intensity, to refer to and characterize the optical output of the laser light source.

Figure 2:
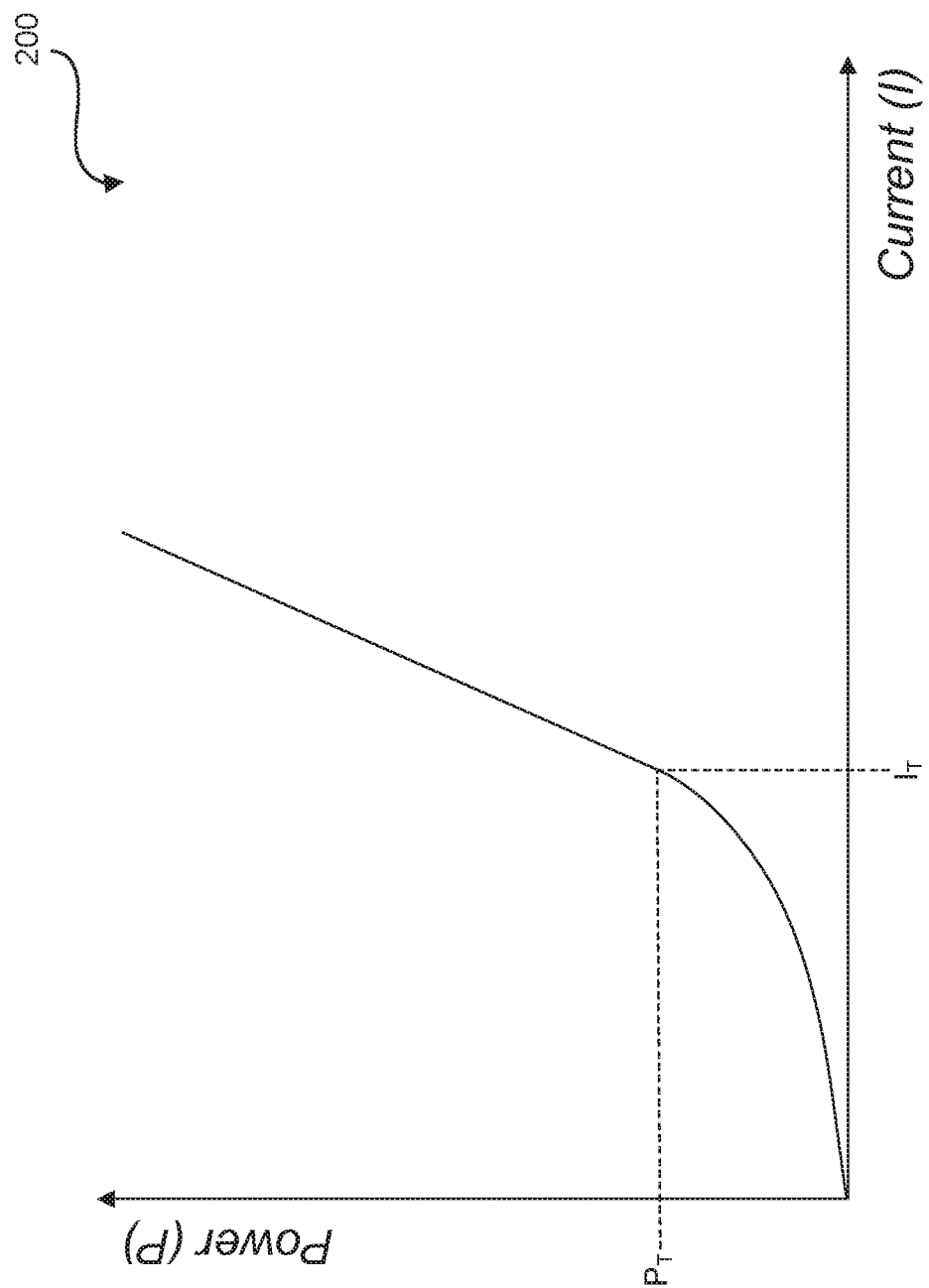
FIG. 2 shows an example graph of power-versus-current, in accordance with a non-limiting implementation of the present specification.

Turning now to FIG. 2, a graph 200 of power versus current is shown for some semiconductor-based lasers. These lasers may have a lasing threshold, above which threshold the output of the laser is predominantly from stimulated emissions and tends to have a relatively narrower wavelength distribution. Below the threshold, the laser output may comprise a relatively higher proportion of spontaneous emissions and the output may have a relatively broader wavelength distribution.

This lasing threshold is represented by a power $P_T$ in FIG. 2, which power corresponds to a driving current IT of the laser. Above the lasing threshold, the relationship between the laser's power and the driving current may be substantially linear. Below the lasing threshold, the relationship between power and current may be more complex and non-linear.

When projecting an image, for some pixels of the image the image data may dictate the laser to have an intensity or power below $P_T$. Operating the laser light source below $P_T$ may, in turn, cause the emitted light to have a relatively broader wavelength distribution. In image projection, the color of the image projected may be in part determined by the color of the laser light used to form the image. As such, deviations in the wavelength of the light source may cause color inaccuracy or color artifacts in the projected image. Such deviations in wavelength may be caused when the wavelength distribution of the light source becomes relatively broad, as for example may be the case when the laser light source is operated below $P_T$. In addition, below $P_T$ the relationship between the laser power and the driving current may be non-linear, which may increase the complexity of controlling the power of the laser by adjusting its driving current.

Figure 3:
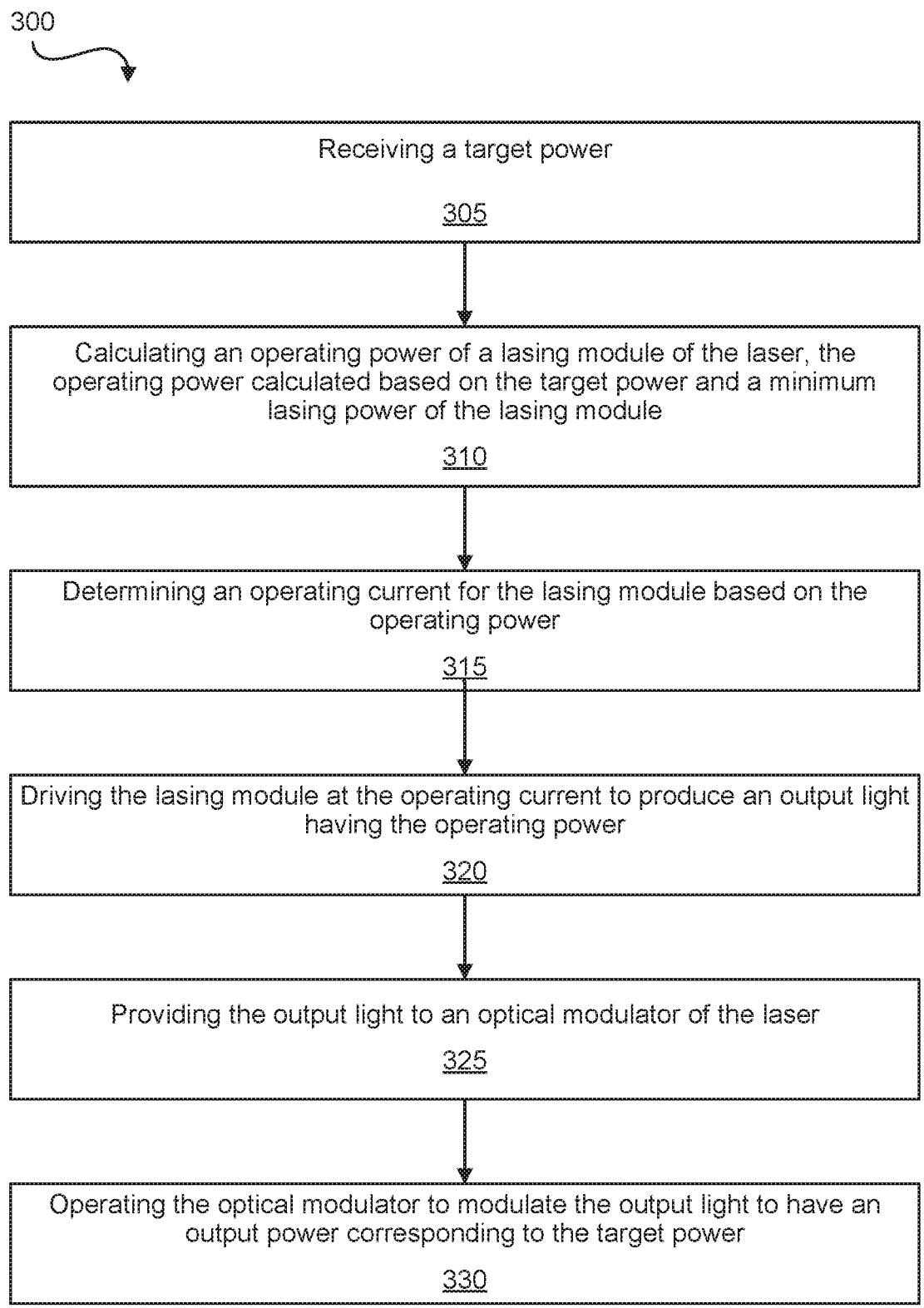
FIG. 3 shows a flow diagram of an example method of operating a laser, in accordance with a non-limiting implementation of the present specification.

Turning now to FIG. 3, a flow diagram representing an example method 300 is shown. Method 300 may be used to operate a laser. In some examples, method 300 may be used to allow a laser to be operated at or above $P_T$ even though a target power demanded from the laser, e.g. by image data, may be below $P_T$. At box 305 of method 300, the target power is received.

At box 310, an operating power of a lasing module of the laser is calculated based on the target power and a minimum lasing power of the lasing module. In some examples, the lasing module may comprise an optical resonance cavity and a gain medium optically coupled with the optical resonance cavity. Furthermore, in some examples the gain medium may comprise a semiconductor material that may emit light when biased electrically. The optical resonance cavity in turn may comprise a waveguide having a reflector at one end to reflect light traveling in the waveguide back into the waveguide. The other end of the waveguide may comprise a partial reflector to reflect some of the light in the waveguide back into the waveguide. In this manner, the light inside the waveguide may travel back and forth, i.e. resonate, in the waveguide between the reflector and the partial reflector. The partial reflector may also transmit some of the light out of the waveguide to form an output light of the lasing module.

The optical field of the light generated by the gain medium may extend into the waveguide to optically couple the gain medium with the waveguide and allow the light generated by the gain medium to enter and resonate in the waveguide. The optical field of the light resonating in the waveguide may in turn extend into the gain medium to allow the resonating light to stimulate light emission by the gain medium. In some examples, the gain medium may be partially or fully in the waveguide to produce optical coupling between the two. Moreover, in some examples the gain medium may be outside of and in abutting contact with the waveguide of the optical resonance cavity.

In some examples, the minimum lasing power may be equal to or greater than the minimum lasing threshold of the laser. For example, the minimum lasing power may be obtained by applying a multiplier to the minimum lasing threshold. This multiplier may be greater than or equal to one, and may comprise values such as about 1.2, about 1.3, or the like. By calculating the operating power based on the minimum lasing power as well as the target power, the operating power at which the lasing module is operated may be selected to be at or above the minimum lasing power. This in turn may allow the lasing module to be operated at or above its minimum lasing threshold $P_T$.

Turning now to box 315, an operating current for the lasing module is determined based on the operating power. This operating current may comprise the electrical biasing current that is applied to the gain medium, which current in turn produces the optical output of the lasing module. In some examples, a power-versus-current graph such as graph 200 may be used to determine the operating current based on a given operating power. In examples where the operating power is calculated to be above the lasing threshold power $P_T$, the relationship between the power and the current may be linear. This linearity may in turn reduce the complexity of determining the operating current to generate a given operating power compared to cases where the relationship between the current and the power is non-linear.

At box 320, the lasing module is driven at the operating current to produce the output light having the operating power. Driving the lasing module at the operating current may comprise biasing the gain medium of the lasing module with the operating current. Once the output light is generated by the lasing module, at box 325 the output light is provided to an optical modulator of the laser. In some examples, the optical modular may receive the output light directly from the lasing module. Moreover, in some examples one or more optical conduits or optical elements may be used to direct or channel the output light from the lasing module to the optical modulator.

The optical modulator may change the power of the output light by attenuating or amplifying the output light. Moreover, in some examples the optical attenuator may be transparent to the output light and may leave the power of the output light substantially unchanged. At box 330, the optical modulator is operated to modulate the output light to have an output power corresponding to the target power. In some examples optical modulator may be operated to modulate the output light to have an output power equal to or about equal to the target power For example, if the target power dictated by the image data is below the minimum lasing power of the lasing module, method 300 may be used to operate the lasing module at an operating power at or above the minimum lasing power, and then use the optical modulator to attenuate the operating power to provide the target power. In this manner, method 300 may allow the lasing module to be operated at or above $P_T$ even if the target power demanded from the laser is below $P_T$.

Figure 4:
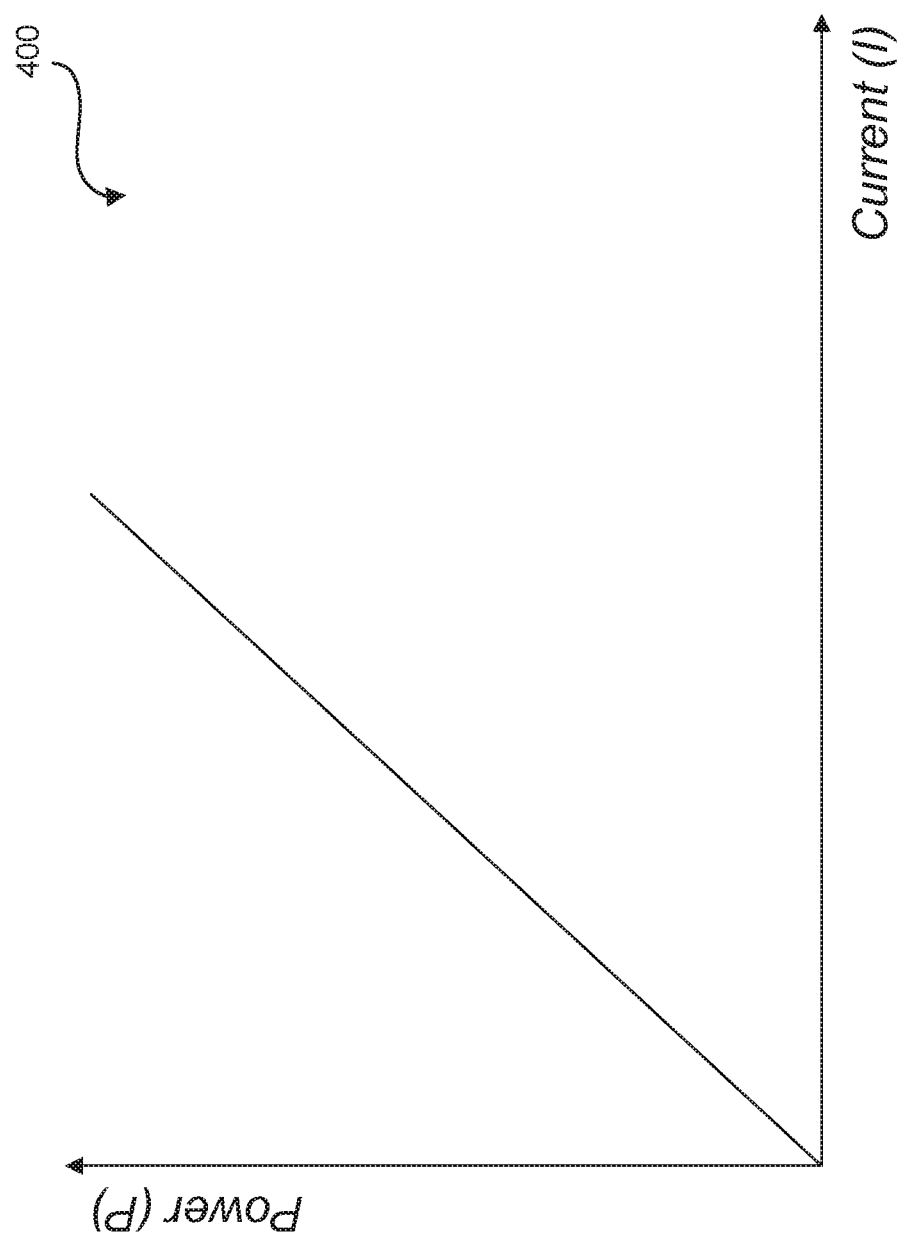
FIG. 4 shows another example graph of power-versus-current, in accordance with a non-limiting implementation of the present specification.

As discussed above, in some examples the optical modulator may add or subtract power from the output light by amplifying or attenuating the output power. In such examples the optical modulator may be used in conjunction with the lasing module to provide a laser which has a substantially linear power-versus-current relationship. FIG. 4 shows an example graph 400 of such a linear powerversus-current relationship. Such a linear power-versus-current relationship may in turn reduce the complexity of operating the laser by allowing the operating current for producing a given output power to be determined based on a linear relationship instead of a relatively more complex non-linear power-versus-current relationship.

In some examples, in order to linearize the power-versus-current relationship using the combination of the lasing module and the optical modulator, a look-up table may be used. This look-up may list values of target power each stored in association with a corresponding operating power of the lasing module and operating parameters for the optical modulator. In operation, when a target power is received, this look-up table may be consulted to determine the operating power and the operating parameters at which the lasing module and the optical modulator should be operated respectively, in order to generate an output light having the target power.

Moreover, it is contemplated that a given target power may be produced using various different combinations of operating power and optical attenuation levels. For example, if the value of the target power is symbolically represented as 2×, the lasing module may be operated at an operating power of 3× and the optical modulator may be operated to provide an attenuation of X. Alternatively, the target power of 2× may be produced by an operating power of 4× and an optical attenuation of 3×, by an operating power of 2× and an optical modulation of zero, by an operating power of X and an optical amplification of X, and the like. As such, different look-up tables may be used each representing a different way of producing the target power using a particular combination of operating power and optical modulation.

In some examples the optical modulator may comprise a semiconductor optical amplifier (SOA). This SOA may be disposed outside the optical resonance cavity of the lasing module, and positioned to receive the output light of the lasing module. Moreover, in some examples the SOA may comprise a gain medium comprising a semiconductor material capable of emitting light when biased. When electrically biased, the SOA may emit light when stimulated by the output light of the lasing module. In this manner, the SOA may amplify the operating power of the lasing module.

In some example, if the SOA is biased at below its light emission threshold, at zero, or reverse biased, the SOA may absorb some of the output light of the lasing module, thereby attenuating the operating power of the lasing module. Furthermore, in some examples the SOA may be biased to be transparent to the output light, in which case the SOA may leave the operating power substantially unchanged.

Referring back to method 300, in some examples the calculating the operating power may comprise comparing the target power to the minimum lasing power. If the target power is below the minimum lasing power, the operating power may be set to be equal to or greater than the minimum lasing power. The operating the optical modulator to modulate the output light may in turn comprise operating the optical modulator to attenuate the operating power to provide the target power. In this manner, for a given target power that is below the minimum lasing power, the lasing module may be operated at an operating power at or above the minimum lasing power, and the optical modulator may be used to attenuate the operating power to provide an output light with the target power. As discussed above, in some examples a SOA that is biased at zero or reverse biased may be used to absorb some of the output light, thereby attenuating the operating power.

If, on the other hand, the target power is at or above the minimum lasing power, the lasing module may be operated at an operating power that is set to be about equal to the target power. In such examples, further modulation of the output light may not be needed, and the SOA may be biased or operated to be transparent to the output light.

In some examples, the lasing module may also have a maximum lasing power. Such a maximum may be determined by thermal loads or other operating characteristics of the gain medium of the lasing module, which characteristics may set an upper limit for the power output of the lasing module. In such examples the calculating the operating power may further comprise comparing the target power to the maximum lasing power of the lasing module. If the target power exceeds the maximum lasing power, the operating power may be set to be equal to or less than the maximum lasing power. Moreover, in such examples the operating the optical modulator to modulate the output light may comprise operating the optical modulator to amplify the operating power to provide the target power. As discussed above, operating the optical modulator to amplify the output light may comprise biasing the SOA to emit light when stimulated by the output light of the lasing module.

Furthermore, in examples where the lasing module has both a minimum and a maximum lasing power, calculating the operating power may further comprise determining if the target power is greater than or equal to the minimum lasing power and less than or equal to the maximum lasing power. If the determination is affirmative, then the operating power may be set to be about equal to the target power. Moreover, in such examples the operating the optical modulator to modulate the output light may comprise operating the SOA to be about transparent to the output light of the lasing module. In addition, in some examples operating the SOA to be about transparent to the output light of the lasing module may comprise biasing the SOA to be about transparent to the output light.

Figure 12:
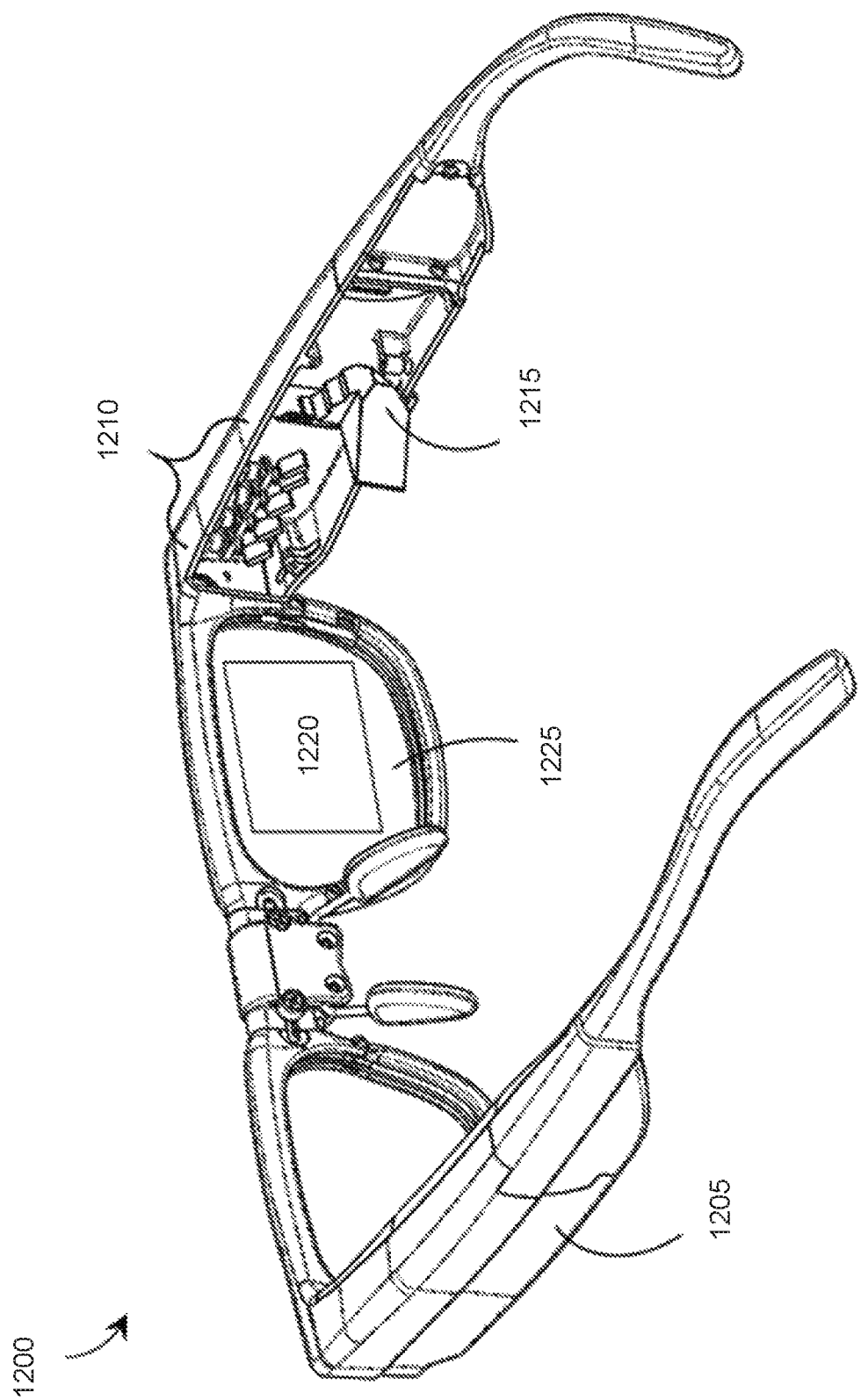
FIG. 12 shows a partial-cutaway perspective view of an example wearable heads-up display, in accordance with a non-limiting implementation of the present specification.

In some examples, the shape or slope of the power-versus-current graph for the lasing module may depend on the temperature of the lasing module. In such examples, method 300 may further comprise receiving a temperature of the lasing module and determining the operating current based on the temperature as well as the operating power. Furthermore, in some examples a look-up table may be consulted in determining the applicable power-versus-current relationship as a function of temperature. Such a look-up table may store temperature values each in association with a corresponding power-versus-current relationship that is applicable at the corresponding temperature value. Once a temperature value is obtained, the look-up table may be consulted to determine the applicable power-versus-current relationship, As discussed above, in some examples lasers may be used to project or display images, and method 300 or the other methods described herein may be used to operate lasers used for projecting or displaying images. For example, the target power may represent an intensity of a color of a pixel of an image, as reflected in the corresponding image data. In such cases, the output light of the laser may be projected, for example, onto a display element of a wearable heads-up display to form a portion of the image. In some examples the display element may comprise a holographic optical element (HOE). An example wearable heads-up display is shown in FIG. 12, and described in relation thereto.

Some display elements such as HOEs may have a relatively narrow wavelength operating range. Moreover, this wavelength operating range may be dependent on the temperature of the display element. When a laser is used in a display system to generate light that is intended to be projected onto the display element, the wavelength of the output light of the laser may be tuned to be in the wavelength operating range of the display element. Moreover, in some examples the wavelength of the output light of the laser may be dynamically tuned in response to changes in the temperature of the display element, which temperature changes may change the wavelength operating grange of the display element.

As such, in some examples the methods described herein further comprise receiving a temperature of the display element, and operating a wavelength selection module of the laser to set a wavelength of the output light of the lasing module based on the temperature. In general, the wavelength selection module may be used to set a wavelength of the output light of the lasing module to be about equal to a target wavelength. As discussed above, in some examples the target wavelength may be determined by the wavelength operating grange of the display element, such as a HOE. In some examples, the wavelength selection module may comprise a tuneable Bragg reflector disposed in the optical resonance cavity.

In addition, in some examples the wavelength of the output light of the lasing module itself may drift over time based on various operating conditions. Examples of such operating conditions may include time of operation, temperature of the lasing module, and the like. As such, in some examples the methods described herein may further comprise sensing the wavelength of the output light using a wavelength sensor and comparing the wavelength with a target wavelength. If the wavelength deviates from the target wavelength by an offset, the wavelength selection module may be operated to adjust the wavelength to reduce the offset. In this manner the wavelength selection module may be used to adjust a drifting wavelength of the output light to bring the wavelength closer to the target wavelength.

Figure 5:
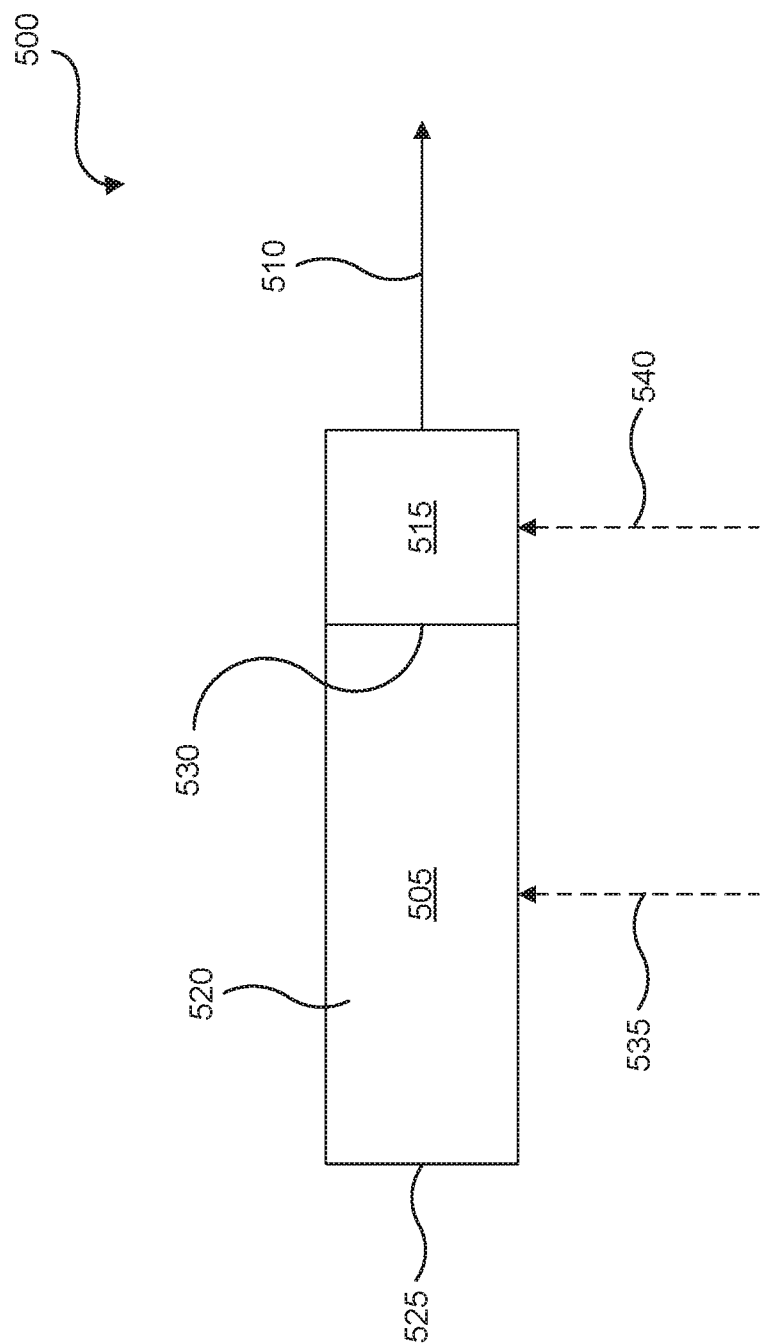
FIG. 5 shows a schematic representation of an example system which may be used to generate a laser light, in accordance with a non-limiting implementation of the present specification.

Turning now to FIG. 5, a schematic representation of an example system 500 is shown. System 500 may be used to generate laser light 510. As such, system 500 may also be referred to as a laser. System 500 comprises a lasing module 505 and an optical modulator 515 positioned to receive an output light generated by the lasing module. Lasing module 505 may comprise an optical resonance cavity and a gain medium optically coupled with the optical resonance cavity, as described above.

Moreover, as described above the optical resonance cavity may comprise a waveguide 520 having a first end 525 and a second end 530. First end 525 may be reflective to reflect the light inside waveguide 520 back into waveguide 520. Second end 530 may be partially reflective, and also partially transmissive to transmit at least some of the light inside waveguide 520 out of waveguide 520 to form an output light of lasing module 505. As shown in FIG. 5, optical modulator 515 may be outside the optical resonance cavity and adjacent second end 530 of waveguide 520. As such, the output light emanating from second end 530 may enter directly into optical modulator 515. As discussed above, in some examples optical modulator 515 may comprise a SOA. While the operation of SOA optical modulators is described herein, it is contemplated that in some examples the optical modulator may comprise a component or mechanism other than a SOA.

The gain medium of lasing module 505 may be controlled by a control signal 535. Similarly, the optical modulator may be controlled by a corresponding control signal 540. In some examples, control signals 535 and 540 may comprise electrical control signals. For example, control signal 535 may be used to bias or drive lasing module 505. Similarly, control signal 540 may be used to bias the SOA (acting as the optical modulator), which bias may be positive, at zero, or negative (i.e. reverse bias).

As discussed above in relation to the methods described herein, lasing module 505 and optical modulator 515 may be operated using control signals 535 and 540 respectively, to allow lasing module 505 to be operated at or above its minimum lasing power, even in cases where the target power is below the minimum lasing power. Moreover, as discussed above in relation to the methods described herein, lasing module 505 and optical modulator 515 may be operated to linearize the power-versus-current characteristics of system 500.

Furthermore, as discussed above, it is contemplated that the power-versus-current characteristics of system 500 may be linearized in different ways. For example, the power-versus-current linear graph may have different slopes depending on the particular linearization used. The choice of linearization used may depend on the characteristics of the lasing module and the optical modulator, as well as on the operating conditions such as temperature. For example, the gain medium of the lasing module may have an optimal operating range defined as a subrange between its minimum and maximum lasing powers. Similarly, the optical modulator may have an optimal operating range for attenuating or amplifying the output light of the lasing module. The particular linearization used may be selected to allow the lasing module and the optical modulator to operate within their respective optimal operating ranges.

Figure 6:
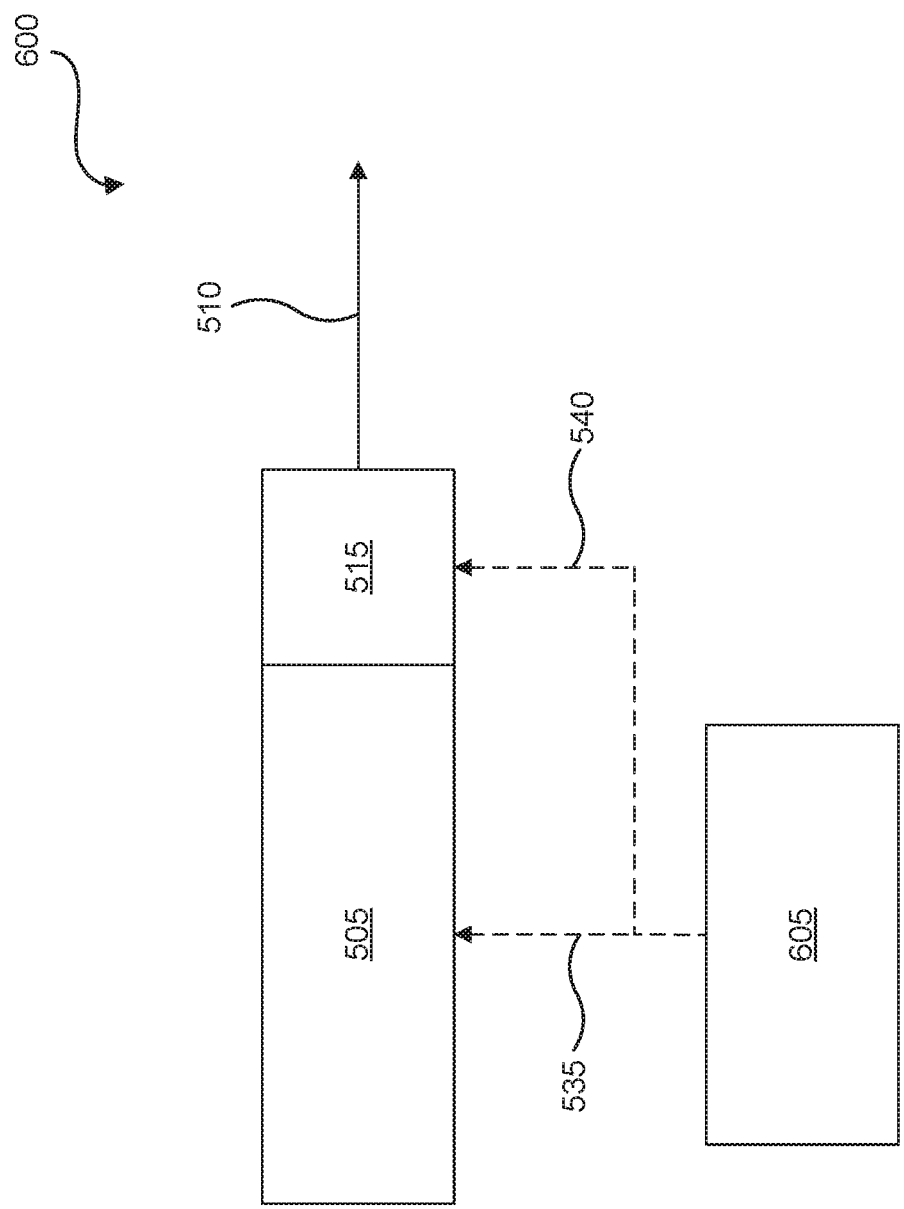
FIG. 6 shows a schematic representation of another example system which may be used to generate a laser light, in accordance with a non-limiting implementation of the present specification.

Turning now to FIG. 6, a schematic representation is shown of an example system 600, which system may be used to generate laser light. System 600 may be similar to system 500, with one difference being that system 600 comprises a controller 605 in communication with lasing module 505 and optical modulator 515. Controller 605 may send control signals 535 and 540 to lasing module 505 and optical modulator 515 respectively, to control their operation. Controller 605 may control lasing module 505 and optical modulator 515 to perform functions similar to those described above in relation to method 300. For example, controller 605 may receive a target power and calculate the operating power of lasing module 505 based on the target power and a minimum lasing power of lasing module 505.

Controller 605 may then determine an operating current for lasing module 505 based on the operating power, and may drive lasing module 505 at the operating current to produce the output light having the operating power. Moreover, controller 605 may drive lasing module 505 using control signal 535. In addition, controller 605 may operate optical modulator 515 to modulate the output light to have an output power corresponding to the target power. Controller 605 may operate optical modulator 515 using control signal 540.

Controller 605 may also control lasing module 505 and optical modulator 515 to carryout the other methods described herein or to perform functions similar to the functions described in relation to the methods described herein. As system 600 need not comprise a wavelength selection module, controller 605 need not carry out the methods or functionalities that involve tuning or selecting the wavelength of output light 510.

Figure 7:
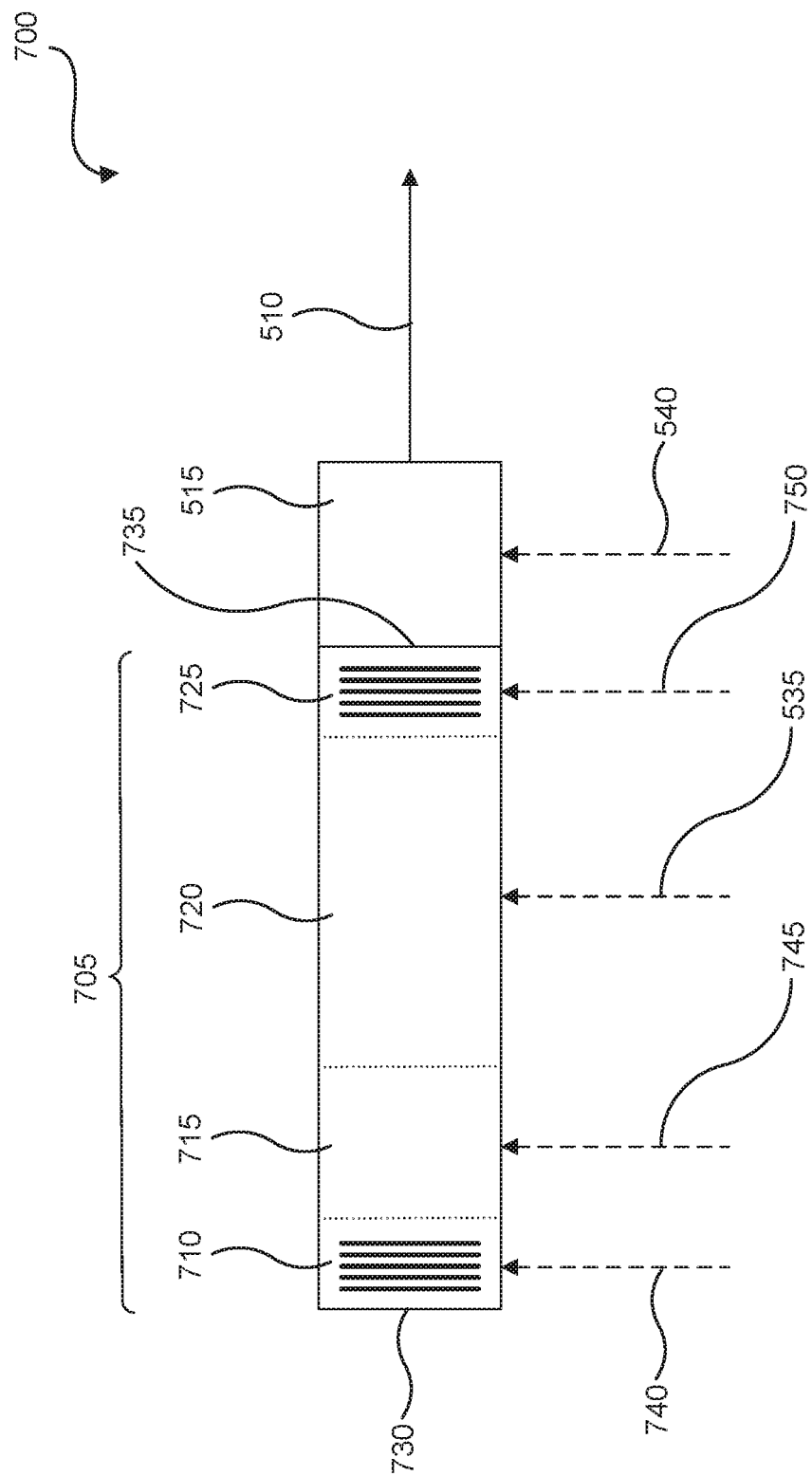
FIG. 7 shows a schematic representation of yet another example system which may be used to generate a laser light, in accordance with a non-limiting implementation of the present specification.

Turning now to FIG. 7, a schematic representation is shown of an example system 700, which system may be used to generate laser light. System 700 may be similar to system 500, with one difference being that system 700 comprises a wavelength selection module. System 700 comprises a lasing module 705 and optical modulator 515, which cooperate to produce output light 510 having the target power. Lasing module 705 may comprise a first tuneable Bragg reflector 710, a phase selection section 715, a gain section 720, and a second tuneable Bragg reflector 725. These components of lasing module 705 may be disposed in a waveguide extending from a first end 730 to a second end 735.

Gain section 720 may be similar to the gain medium in lasing module 505. Gain section 720 may comprise a semiconductor material capable of emitting light when biased electrically. This light may then resonate in the waveguide and may be emitted as the output light of the lasing module. Control signal 535 may be used to control or electrically bias the light emitting semiconductor material in gain section 720.

Reflector 725, phase selection section 715, and reflector 725 may collectively act as a wavelength selection module. Moreover, reflector 725, phase selection section 715, and reflector 725 may receive control signals 740, 745, and 750 respectively. In some examples, control signals 740, 745, and 750 may comprise electrical control signals. In the case of Bragg reflectors 710 and 725, control signals 740 and 750 may change the refractive index of the materials forming the Bragg reflectors, thereby changing the reflectance of Bragg reflectors 710 and 725. In the case of phase selection section 715, control signal 745 may also change the refractive index, thereby changing the optical resonance cavity modes in the waveguide.

Figure 8:
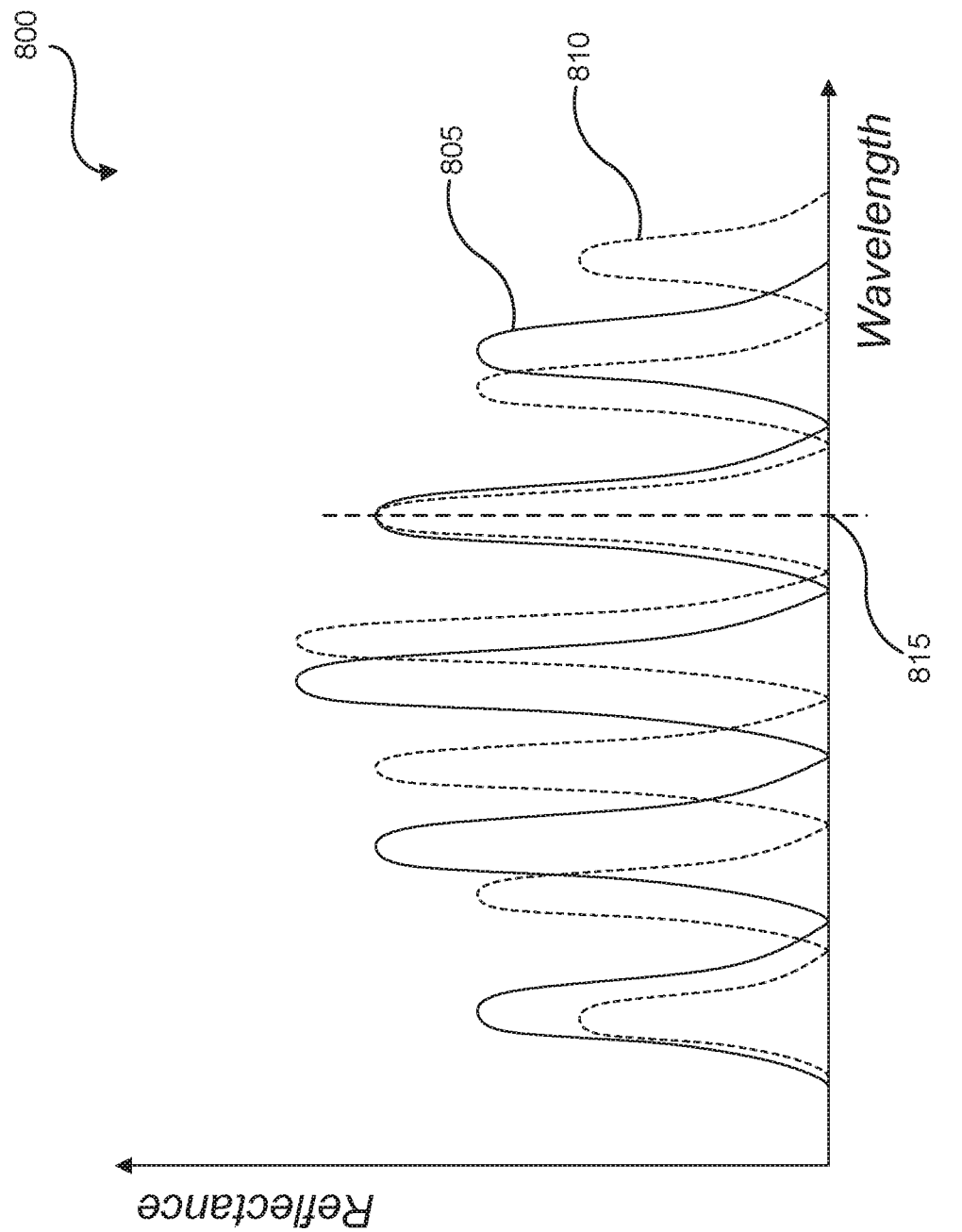
FIG. 8 shows a graph of example reflectance spectra as a function of wavelength, in accordance with a non-limiting implementation of the present specification.

In some examples, reflector 710 may have a different reflectance spectrum than reflector 725. For example, the material composition or the structure of reflectors 710 and 727 may be different from one another, to produce a difference in their respective reflectance spectra. In such examples, a Vernier-type effect may be used to tune or select the wavelength of output light 510. FIG. 8 depicts a graph 800, which shows as a function of wavelength an example reflectance spectrum 805 of reflector 710 and an example reflectance spectrum 810 of reflector 725.

Reflectance spectra 805 and 810 have an overlapping reflectance peak at wavelength 815. At wavelength 815 both reflectors 710 and 725 reflect strongly, thereby allowing light of wavelength 815 to resonate in the waveguide and ultimately be emitted as output light 510. It is noted that at wavelength 815 reflector 725 may transmit some of the light at wavelength 815 out of the waveguide to form output light 510.

At wavelengths other than wavelength 815, at least one of reflectors 710 and 725 may have a relatively low reflectance, thereby supressing the optical resonance at wavelengths other than wavelength 815. By electrically biasing reflectors 710 and 725 using control signals 740 and 750 respectively, wavelength spectra 805 and 810 may be changed or shifted along the wavelength axis independently of one another. This shifting may, in turn, change the wavelength at which reflectance peaks of reflectance spectra 805 and 810 overlap to a new overlap wavelength. This new overlap wavelength may in turn represent the new wavelength which is selected, or to which output light 510 of system 700 is tuned by reflectors 710 and 725.

While FIG. 8 shows reflectors 710 and 725 as having different reflectance spectra, it is contemplated that in some examples reflectors 710 and 725 may have the same structure and composition, thereby having the same reflectance spectra. In such cases, electrically biasing the Bragg reflectors 710 and 725 may still shift the peaks in their reflectance spectra, thereby selecting or tuning the wavelength of the output light. However, in examples where reflectors 710 and 725 have the same reflectance spectra, Vernier-type wavelength tuning may not be available.

It is also contemplated that in some examples the wavelength selection module may comprise one tuneable Bragg reflector, which may be disposed near one end of the waveguide. Referring to FIG. 7, in examples where the one tuneable Bragg reflector is disposed proximate first end 730, second end 735 of the waveguide may comprise a partial reflector to partially reflect the resonating light back into the waveguide and to partially transmit some of the resonating light to form the output light. Similarly, in examples where the one tuneable Bragg reflector is disposed proximate second end 735, the first end may comprise a reflector to reflect the resonating light back into the waveguide.

While the foregoing describes the tuneable reflector as comprising tuneable Bragg reflectors, it is contemplated that other types of tuneable reflectors may be used instead of or in addition to Bragg reflectors. Moreover, while FIG. 7 shows the wavelength selection module as comprising phase selection section 715 as well as tuneable reflectors 710 and 725, it is contemplated that in some examples the wavelength selection module need not comprise a phase selection section, and may comprise one or more tuneable reflectors.

Referring back to FIG. 7, while reflector 710 may comprise a tuneable and wavelength-selective reflector, end 730 of the waveguide may function as a broad-spectrum or non-selective reflector. Non-selective reflections from end 730 may interfere with the wavelength tuning functionality of the wavelength selection module. To reduce reflections from end 730, in some examples end 730 may be coated with an anti-reflective coating. Moreover, in some examples end 730 may be coupled with an optically absorbing medium to absorb light beams that arrive at end 730, thereby reducing the amount of light that is reflected from end 730. Furthermore, in some examples instead of terminating in the surface or facet of end 730, the waveguide may terminate by tapering into a smaller cross-section or to a point, or may terminate in a spiral, to reduce reflections from the facet or surface of end 730.

Figure 9:
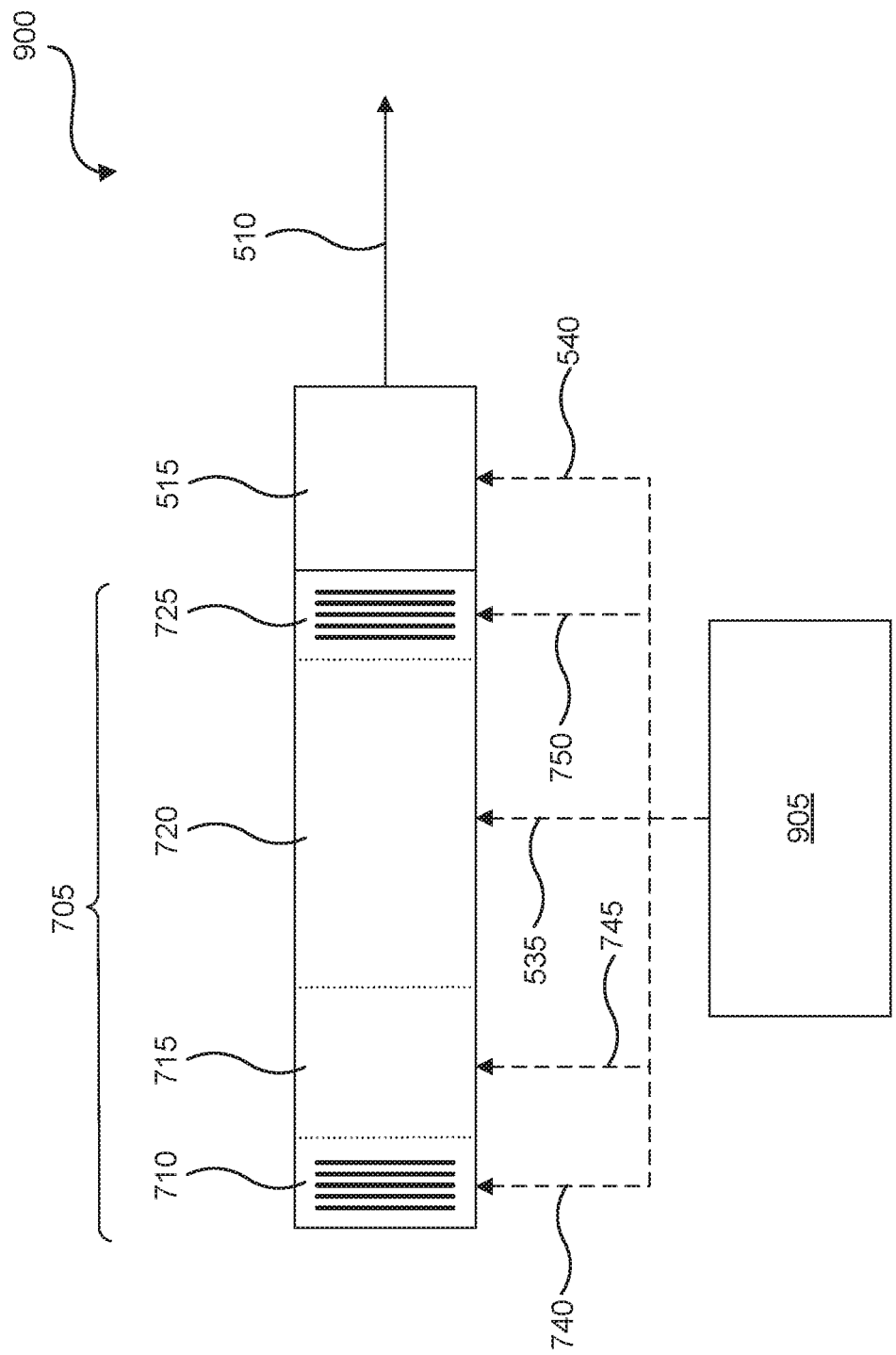
FIG. 9 shows a schematic representation of yet another example system which may be used to generate a laser light, in accordance with a non-limiting implementation of the present specification.

Turning now to FIG. 9, a schematic representation is shown of an example system 900, which system may be used to generate laser light. System 900 may be similar to system 700, with one difference being that system 900 comprises a controller 905 in communication with lasing module 705 and optical modulator 515. Controller 905 may share some of the structural and functional attributes of controller 605. For example, controller 905 may send control signals 535 and 540 to gain section 720 and optical modulator 515 respectively. In addition, controller 905 may be in communication with the wavelength selection module, and may send control signals 740, 745, and 750 to reflector 710, phase selection section 715, and reflector 725 respectively. In some examples, control signals 740, 745, and 750 may be used to apply electrical biases to reflector 710, phase selection section 715, and reflector 725 respectively. By controlling the various components of lasing module 705 and optical modulator 515, controller 905 may carryout the methods or perform the functions described in relation to method 300 and the other methods described herein.

As discussed above in relation to FIG. 2, some semiconductor-based laser light sources may have a relatively broad wavelength spectrum, particularly when operated below their $P_T$. In cases where these laser light sources do not comprise a wavelength selection module, binning may be used to divide the wavelength spectrum emitted by these laser light sources into various wavelength ranges or bins. These bins have a narrower wavelength distribution than the full wavelength spectrum of the laser light. The light in some of the bins may then be used to form an image, while the light in the remaining bins may be discarded. The methods and systems described herein may reduce the need for binning.

Operating the lasing modules at or above their $P_T$ may allow for the output light to have a relatively narrower wavelength spectrum. In addition, the wavelength selection modules may be used to further tune the wavelength of the output light, for example according to the image projection specifications or to the display element's wavelength operating range. As the wavelength spectrum of the output laser light may be relatively narrow and tuneable, the need for binning may be reduced or eliminated.

Figure 10:
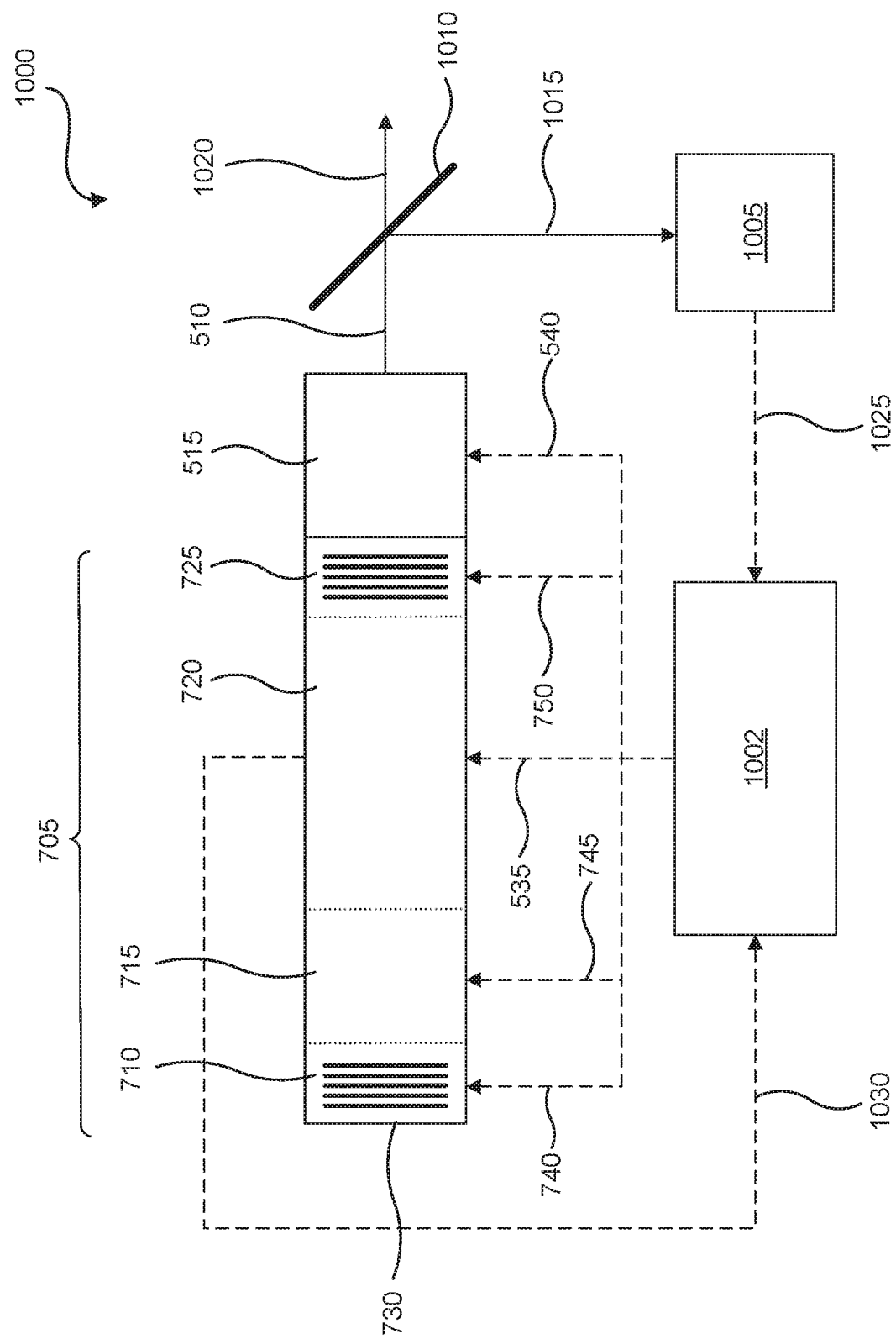
FIG. 10 shows a schematic representation of yet another example system which may be used to generate a laser light, in accordance with a non-limiting implementation of the present specification.

Turning now to FIG. 10, a schematic representation is shown of an example system 1000, which may be used to generate laser light. System 1000 may be similar to system 900. System 1000 may comprise a controller 1002, which may share some of the structural and functional attributes of controller 905.

One difference between systems 1000 and 900 is that system 1000 may comprise a wavelength sensor 1005. A beam splitter 1010 may be used to split output light 510 to form a first beam 1015 and a second beam 1020. First beam 1015 may be directed to wavelength sensor 1005, and second beam 1020 may form an output of system 1000 and be used, for example, in applications such as image projection and the like. In other words, wavelength sensor 1005 may be in optical communication with lasing module 705. As shown in FIG. 10, this optical communication may be via beam splitter 1010.

Wavelength sensor 1005 in turn may be in communication with controller 1002, and may send a signal 1025 to controller 1002 to communicate the sensed wavelength to controller 1002. Controller 1002 may then compare the sensed wavelength with the target wavelength, which for example may be dictated by image data. If the sensed wavelength deviates from the target wavelength by an offset, controller 1002 may send control signals to the wavelength selection module to adjust or tune the wavelength of output light 510 to reduce the offset. Adjusting or tuning the wavelength may also be referred to as setting the wavelength. For example, controller 1002 may send signals 740, 745, and 750 respectively to reflector 710, phase selection section 715, and reflector 725 to adjust or tune the wavelength of output light 510. In this manner, if the wavelength of output light 510 drifts from the target wavelength, system 1000 may sense the deviation and use the wavelength selection module to tune the wavelength to reduce the drift or offset from the target wavelength.

Furthermore, while FIG. 10 shows output light 510 being sampled by beam splitter 1010 to form beam 1015 whose wavelength is then sensed by wavelength sensor 1005, it is contemplated that in some examples the wavelength of the output light may be sensed by directing to a wavelength sensor light that may propagate out of lasing module 705 through end 730. In such examples, reflector 710 may transmit a portion of the light resonating in the waveguide to form a wavelength sampling output, which sampling output may in turn be directed to a wavelength sensor.

In addition, in system 1000 controller 1002 may receive information about the temperature of lasing module 705 in the form of a signal 1030. While FIG. 10 shows signal 1030 originating directly from lasing module 705, it is contemplated that in some examples a separate component may obtain the temperature of lasing module 705, and then communicate the temperature to controller 1002. Controller 1002 may then determine the operating current (sent through control signal 535) based on the operating power and the temperature. In other words, the relationship between the driving current and the power generated by the lasing module may be dependent on the temperature of the lasing module. By using the temperature information, controller 1002 may be able to select the operating current to produce the operating power at the temperature at which the lasing module is operating.

Figure 11:
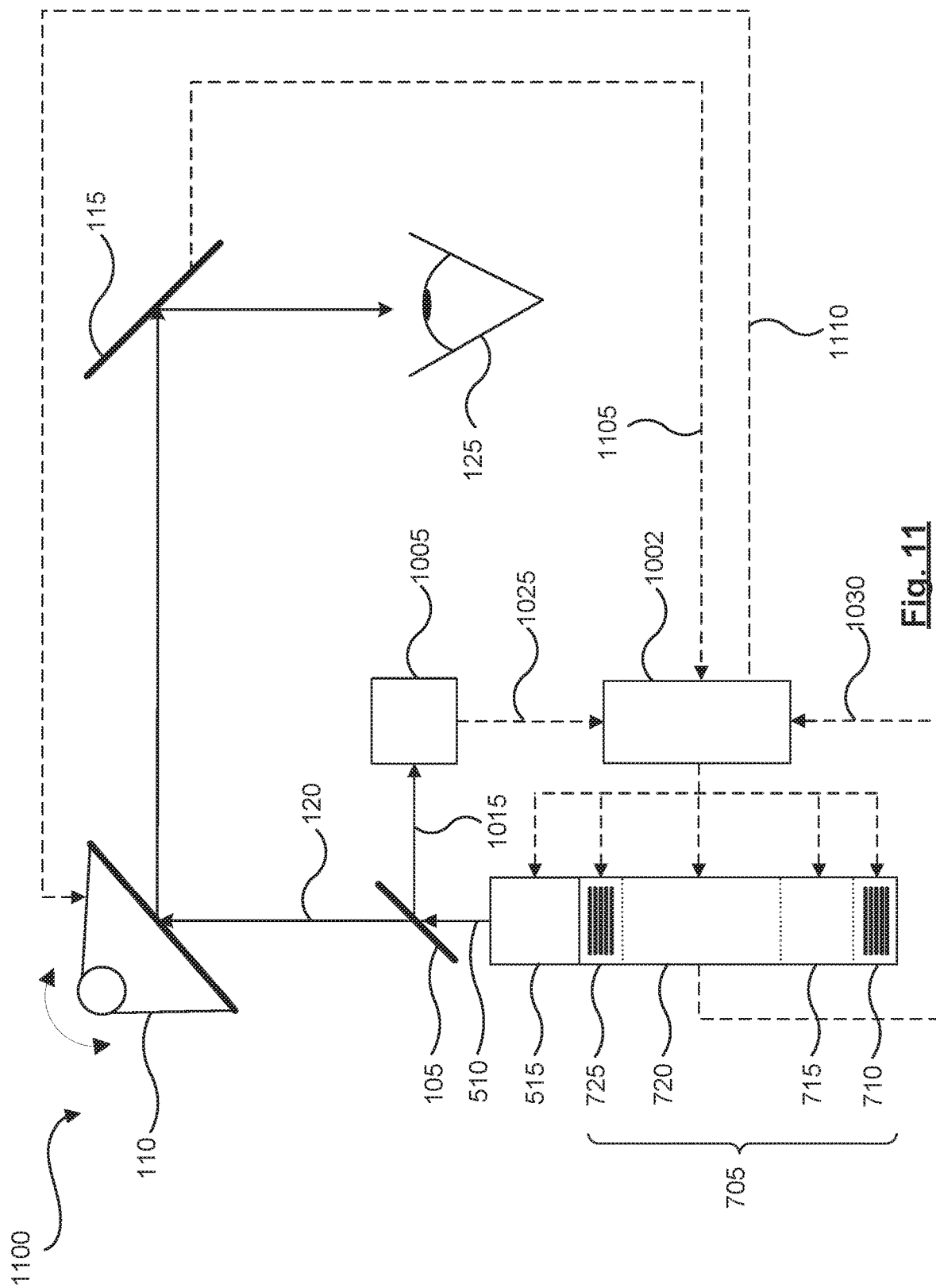
FIG. 11 shows a schematic representation of another example system which may be used to display an image, in accordance with a non-limiting implementation of the present specification.

Turning now to FIG. 11, a schematic representation is shown of an example system 1100, which system may be used to display an image. System 1100 comprises system 100 in which light source 105 comprises system 1000. In system 1100 the output light (i.e. beam 1020 shown in FIG. 10) generated by system 1000 is used to form beam 120 of light, which is then received by spatial modulator 110.

In other words, system 1100 comprises lasing module 705 to generate output light 510, and optical modulator 515 positioned to receive the output light from lasing module 705. System 1100 also comprises spatial modulator 110, which receives a portion of the output light from optical modulator 515. Moreover, system 1100 comprises display element 115 which receives the output light from spatial modulator 110. In addition, system 1100 comprises controller 1002, which is in communication with lasing module 705, optical modulator 515, and spatial modulator 110. Controller 1002 may communicate with or control spatial modulator 110 by sending a control signal 1110 to spatial modulator 110.

While FIG. 11 shows controller 1002 as being in communication with spatial modulator 110, it is contemplated that in some examples controller 1002 need not be in communication with spatial modulator 110 and a separate component may control spatial modulator 110 instead of or in addition to controller 1002.

Controller 1002 may carry out the methods and perform the functions described in relation to method 300 and the other methods described herein. For example, controller 1002 may receive image data related to a pixel of an image, and may obtain a target power and a target position from the image data. Target power may be based on the brightness of the pixel and the target position may be based on the position of the pixel in the image.

Controller 1002 may then calculate an operating power of lasing module 705 based on the target power and a minimum lasing power of lasing module 705. Then controller 1002 may determine an operating current for lasing module 705 based on the operating power, and drive lasing module 705 at the operating current to produce the output light having the operating power. Controller 1002 may use control signal 535 (shown in FIG. 10) to drive gain section 720 of lasing module 705 to produce the output light having the operating power.

In addition, controller 1002 may operate optical modulator 515 to modulate the output light to have an output power corresponding to the target power. Controller 1002 may use control signal 540 (shown in FIG. 10) to control or operate optical modulator 515 to modulate the output light. Furthermore, controller 1002 may operate spatial modulator 110 to direct the output light onto display element 115 based on the target position. Controller 1002 may control or operate spatial modulator 110 using a control signal 1110.

Moreover, controller 1002 may receive a temperature of display element 115 using a signal 1105. While FIG. 11 shows controller 1002 receiving the temperature signal directly from display element 115, it is contemplated that in some examples another component may obtain the temperature of display element 115 and may then communicate the temperature to controller 1002. Upon receiving the temperature, controller 1002 may operate the wavelength selection module to set the wavelength of the output light based on the temperature. This, in turn, may allow controller 1002 to tune or adjust the wavelength of output light based on changes to the operating wavelength range of display element 115, which operating wavelength range may be determined by the temperature of display element 115. Controller 1002 may also perform the functions described in relation to method 300 and the other methods described herein.

For example, controller 1002 may control reflectors 710 and 725 and phase selection section 715 of the wavelength selection module to tune or select the wavelength of output light 510. As discussed above, this tuning may be used to set the wavelength of output light 510 to be about equal to a target wavelength and to reduce wavelength drifts related to operating time or temperature of lasing module 705. Tuning the wavelength may also allow the wavelength range of output light 510 to be tuned to the wavelength operating range of display element 115. In addition, in some examples the ability to tune the wavelength of the output light may allow for selection of exit pupils or may allow for reducing the active exit pupils.

While FIG. 11 shows that system 1100 comprises system 1000 integrated with and used as the light source for system 100, it is contemplated that in some examples systems 600 or 900 may also be used as the light source in system 1100, instead of or in addition to system 1000. To the extent systems 600 or 900 may have fewer features or functionalities than system 1000, the system formed by integrating systems 600 or 900 as the light source in system 100 may have correspondingly fewer features or functionalities compared to system 1100.

In some examples, the controllers described herein such as controllers 605, 905, and 1002, may comprise a processor in communication with a non-transitory processor-readable medium. The processor-readable medium may comprise instructions to cause the processors to control the lasing module, the optical modulator, the wavelength selection module, or the spatial modulator as described in relation to the methods described herein. Moreover, in some examples the controllers may be free-standing components, while in other examples the controllers may comprise functional modules incorporated into other components of their respective systems.

Furthermore, in some examples the controllers or their functionality may be implemented in other ways, including: via Application Specific Integrated Circuits (ASICs), in standard integrated circuits, as one or more computer programs executed by one or more computers (e.g., as one or more programs running on one or more computer systems), as one or more programs executed by on one or more controllers (e.g., microcontrollers), as one or more programs executed by one or more processors (e.g., microprocessors, central processing units, graphical processing units), as firmware, and the like, or as a combination thereof.

Turning now to FIG. 12, a partial-cutaway perspective view of an example wearable heads-up display (WHUD) 1200 is shown. WHUD 1200 includes a support structure 1205 that in use is worn on the head of a user and has the general shape and appearance of an eyeglasses (e.g., sunglasses) frame. Eyeglasses or sunglasses may also be generically referred to as "glasses". Support structure 1205 may carry components of a system to display an image, such as system 1100. For example, system 1000 to generate a laser light may be received in a space 1210 in a side arm of support structure 1205. In other examples, one or more of the systems described herein may be received in or carried by support structure 1205, instead of or in addition to system 1000.

Spatial modulator 110 may be received in or be part of component 1215 of support structure 1205. In other examples, instead of or in addition to spatial modulator 110, one or more other types of spatial modulators may be carried by support structure 1205. Spatial modulator 110 in turn may direct the laser light onto a display element 1220 carried by a lens 1225 of support structure 1205. In some examples, display element 1220 may be similar in structure and function to display element 115.

The term "carries" and variants such as "carried by" are generally used to refer to a physical coupling between two objects. The physical coupling may be direct physical coupling (i.e., with direct physical contact between the two objects) or indirect physical coupling that may be mediated by one or more additional objects. Thus, the term carries and variants such as "carried by" are meant to generally encompass all manner of direct and indirect physical coupling, including without limitation: carried on, carried within, physically coupled to, or supported by, with or without any number of intermediary physical objects therebetween.

Moreover, in the drawings dashed arrows are used to illustrate communications between the various components. While these dashed arrows indicate a particular direction extending from a first component to a second component for each arrow, it is contemplated that in some examples the arrows may also represent two-way communication between their respective components, or the arrows may represent communication between components in a direction opposite the direction indicated by the dashed arrows.

In addition, FIGS. 6, 9, 10, and 11 show one dashed line emanating from the controller, which line then branches into multiple dashed lines reaching towards various components of the lasing module and the optical modulator. It is contemplated that the one dashed line emanating from the controller may comprise a multi-channel communication link or multiple communication links, which would in turn allow the controller to simultaneously send different control signals to different components of the lasing module and the optical modulator.

In the above description, the systems are described as carrying out the methods or performing the functions of method 300 and the other methods described herein. It is contemplated that in some examples the systems described herein may carry out methods or perform functions other than those of the methods described herein. Moreover, while method 300 and the other methods described herein may be performed by some or all of the systems described herein, it is contemplated that in some examples method 300 and the other methods described herein may also be performed using systems or devices other than the systems described herein.

Throughout this specification and the appended claims, infinitive verb forms are often used. Examples include, without limitation: "to generate," "to produce," "to modulate," "to attenuate," and the like. Unless the specific context requires otherwise, such infinitive verb forms are used in an open, inclusive sense, that is as "to, at least, generate," to, at least, produce," "to, at least, modulate," and so on.

The above description of illustrated example implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. Moreover, the various example implementations described herein may be combined to provide further implementations.

In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of operating a laser, the method comprising:
receiving a target power;
calculating an operating power of a lasing module of the laser, the lasing module comprising an optical resonance cavity and a gain medium optically coupled with the optical resonance cavity, and the operating power calculated based on the target power and a minimum lasing power of the lasing module;
determining an operating current for the lasing module based on the operating power;
driving the lasing module at the operating current to produce an output light having the operating power;
providing the output light to an optical modulator of the laser, the optical modulator comprising a semiconductor optical amplifier disposed outside the optical resonance cavity; and
operating the optical modulator to modulate the output light to have an output power corresponding to the target power, wherein operating the optical modulator comprises at least one of:
operating the optical modulator to attenuate the operating power to provide the target power by biasing the semiconductor optical amplifier to absorb some of the output light, wherein the biasing the semiconductor optical amplifier to absorb some of the output light comprises one of biasing the semiconductor optical amplifier at zero or reverse biasing the semiconductor optical amplifier;
operating the optical modulator to amplify the operating power to provide the target power by biasing the semiconductor optical amplifier to emit light when stimulated by the output light of the lasing module; or
biasing the semiconductor optical amplifier to be about transparent to the output light of the lasing module.

2. The method of claim 1, wherein calculating the operating power comprises:
comparing the target power to the minimum lasing power; and
if the target power is below the minimum lasing power, setting the operating power to be equal to or greater than the minimum lasing power.

3. The method of claim 2, wherein calculating the operating power further comprises:
if the target power is equal to or greater than the minimum lasing power, setting the operating power to be about equal to the target power.

4. The method of claim 2, wherein calculating the operating power further comprises:
comparing the target power to a maximum lasing power of the lasing module; and
if the target power exceeds the maximum lasing power, setting the operating power to be equal to or less than the maximum lasing power.

5. The method of claim 1, further comprising:
receiving a temperature of the lasing module, wherein determining the operating current for the lasing module comprises determining the operating current based on the operating power and the temperature.

6. The method of claim 1, further comprising:
operating a wavelength selection module of the laser to set a wavelength of the output light of the lasing module to be about equal to a target wavelength.

7. The method of claim 6, further comprising:
sensing the wavelength of the output light using a wavelength sensor;
comparing the wavelength with the target wavelength; and
if the wavelength deviates from the target wavelength by an offset, operating the wavelength selection module to adjust the wavelength to reduce the offset.

8. A method of operating a laser, the method comprising:
receiving a target power, wherein the target power represents an intensity of a color of a pixel of an image;
calculating an operating power of a lasing module of the laser, the operating power calculated based on the target power and a minimum lasing power of the lasing module;
determining an operating current for the lasing module based on the operating power;
driving the lasing module at the operating current to produce an output light having the operating power;
providing the output light to an optical modulator of the laser;
operating the optical modulator to modulate the output light to have an output power corresponding to the target power;
projecting the output light onto a display element of a wearable heads-up display to form a portion of the image;
receiving a temperature of the display element; and
operating a wavelength selection module of the laser to set a wavelength of the output light of the lasing module based on the temperature.

9. A system to generate laser light, the system comprising:
a lasing module comprising an optical resonance cavity and a gain medium optically coupled with the optical resonance cavity;
an optical modulator positioned to receive an output light generated by the lasing module,
wherein the output light is to be projected onto a display element of a wearable heads-up display to form a portion of an image;
a wavelength selection module to set a wavelength of the output light; and
a controller in communication with the lasing module, the wavelength selection module, and the optical modulator, the controller to:
receive a target power representing an intensity of a color of a pixel of the image;
calculate an operating power of the lasing module based on the target power and a minimum lasing power of the lasing module;
determine an operating current for the lasing module based on the operating power;
drive the lasing module at the operating current to produce the output light having the operating power;
receive a temperature of the display element;

operate the optical modulator to modulate the output light to have an output power corresponding to the target power; and operate the wavelength selection module to set the wavelength of the output light based on the temperature.

10. The system of claim 9, wherein the optical modulator comprises a semiconductor optical amplifier disposed outside the optical resonance cavity.

11. The system of claim 9, wherein the controller is further to:

receive a temperature of the lasing module; and determine the operating current based on the operating power and the temperature.

12. A system to generate laser light, the system comprising:

a lasing module comprising an optical resonance cavity and a gain medium optically coupled with the optical resonance cavity;

an optical modulator positioned to receive an output light generated by the lasing module;

a wavelength selection module to set a wavelength of the output light and comprising a tuneable Bragg reflector disposed in the optical resonance cavity; and a controller in communication with the lasing module, the wavelength selection module, and the optical modulator, the controller to:

receive a target power;

calculate an operating power of the lasing module based on the target power and a minimum lasing power of the lasing module;

determine an operating current for the lasing module based on the operating power;

drive the lasing module at the operating current to produce the output light having the operating power;

operate the wavelength selection module to set the wavelength of the output light of the lasing module to be about equal to a target wavelength; and operate the optical modulator to modulate the output light to have an output power corresponding to the target power.

13. The system of claim 12, further comprising:

a wavelength sensor in optical communication with the lasing module and in communication with the controller, the wavelength sensor to sense the wavelength of the output light; and wherein the controller is further to:

receive the wavelength from the wavelength sensor;

compare the wavelength with the target wavelength; and if the wavelength deviates from the target wavelength by an offset, operate the wavelength selection module to adjust the wavelength to reduce the offset.

14. A system to generate laser light, the system comprising:

a lasing module comprising an optical resonance cavity and a gain medium optically coupled with the optical resonance cavity;

an optical modulator positioned to receive an output light generated by the lasing module;

a spatial modulator to receive the output light from the optical modulator;

a display element to receive the output light from the spatial modulator; and a controller in communication with the lasing module, the optical modulator, and the spatial modulator, the controller to:

receive a target power;

calculate an operating power of the lasing module based on the target power and a minimum lasing power of the lasing module;

determine an operating current for the lasing module based on the operating power;

drive the lasing module at the operating current to produce the output light having the operating power; and operate the optical modulator to modulate the output light to have an output power corresponding to the target power.

15. The system of claim 9, wherein:

the lasing module has a minimum lasing threshold; and the minimum lasing power is equal to or greater than the minimum lasing threshold.

* * * * *